US009166136B1

(12) United States Patent
Hill et al.

(10) Patent No.: US 9,166,136 B1
(45) Date of Patent: *Oct. 20, 2015

(54) NANOSTRUCTURED THERMOELECTRIC LAMINATES AND A METHOD TO ENHANCE THE POWER FACTOR AND AERIAL POWER DENSITY OF SUCH THERMOELECTRIC LAMINATES BASED ON VERTICALLY ORIENTED AND DENSLY ARRAYED NANOWIRES (71) Applicant: Mainstream Engineering Corporation, Rockledge, FL (US)

(72) Inventors: Justin J. Hill, Merritt Island, FL (US); Gregory Chester, Orlando, FL (US); Paul E. Yelvington, Rockledge, FL (US)

(73) Assignee: MAINSTREAM ENGINEERING CORPORATION, Rockledge, FL (US)

( * ) Notice: Subject to any disclaimer, the term of this patent is extended or adjusted under 35 U.S.C. 154(b) by 186 days.

This patent is subject to a terminal disclaimer.

(21) Appl. No.: 13/863,010

(22) Filed: Apr. 15, 2013

(51) Int. Cl.
*H01M 4/80* (2006.01)
*H01L 35/02* (2006.01)
*H01L 31/02* (2006.01)
*H01L 35/34* (2006.01)
*H01M 10/00* (2006.01)
*C01B 33/02* (2006.01)
*C01B 33/10* (2006.01)
*B82Y 30/00* (2011.01)

(52) U.S. Cl.
CPC ............. *H01L 35/02* (2013.01); *B82Y 30/00* (2013.01); *C01B 33/02* (2013.01); *C01B 33/10* (2013.01); *H01L 31/02* (2013.01); *H01L 35/34* (2013.01); *H01M 10/00* (2013.01); *C01B 2202/08* (2013.01); *Y02E 60/12* (2013.01)

(58) Field of Classification Search
CPC ........ B82Y 30/00; Y02E 60/12; C01B 33/02; C01B 33/10; C01B 2202/08
USPC .................................................. 429/122, 236
See application file for complete search history.

(56) References Cited

U.S. PATENT DOCUMENTS 7,267,859 B1 *  9/2007  Rabin et al. ................... 428/131
2006/0118712 A1 *  6/2006  Yang et al. ..................... 250/288
2009/0297913 A1 * 12/2009  Zhang et al. .................... 429/33

(Continued)

OTHER PUBLICATIONS

Amy Prieto, Melissa Sander, Marisol Martin-Gonzalez, Ronald Gronsky, Timothy Sands, and Angelica Stacy, "Electrodeposition of Ordered Bi2Te3 Nanowire Arrays", Jun. 28, 2001, Journal of American Chemical Society 2001, 123, 7160-7161.*

(Continued)

*Primary Examiner* — Jonathan Jelsma (57) ABSTRACT

Nanostructured elements and a method for fabricating such nanostructured elements with an enhanced power and aerial power density are disclosed. A hierarchical template with ordered and arrayed nanopores is produced on either a mating part or a support material that is pre-shaped so as to be conformable to the mating part. At least one compound can be optionally layered within the nanopores to reduce the diameter thereof. The template is supplied with filling material having selected electrical or thermoelectric properties. Selective removal of the template produces freestanding nanostructure arrays which are then backfilled with thermoelectric material or the like to form a nanostructure array comprised of nanowires supported by the backfilled material on the substrate.

17 Claims, 6 Drawing Sheets

(56) References Cited

U.S. PATENT DOCUMENTS

2012/0152295 A1* 6/2012 Matus et al. .................. 136/200
2012/0319082 A1* 12/2012 Yi et al. ........................ 257/15

OTHER PUBLICATIONS

Hicks and Dresselhaus; Thermoelectric figure of merit of a one-dimensional conductor. Phys. Rev. B, 1993, (47), 16631-16634].

Kim, Stoscio, Bhatt, Mickevicius and Mitin; Electron-Optical-Phonon Scattering Rates in a Rectangular Quantum Wire. J. Appl. Phys., 1991, (70), 319-325.

Hill, Cotton and Ziegler; Alignment and Morphology Control of Ordered Mesoporous Silicas in Anodic Aluminum Oxide Channels by Electrophoretic Deposition. Chem. Mater., 2009, (21), 1841-1846.

Liu, Wang, Indacochea and Wang; Interference color of anodized aluminum oxide (AAO) films for sensor application, Sensors and Smart Structures Technologies for Civil, Mechanical, and Aerospace Systems 2009, 2009, (7292), 729217-11.

Hochbaum, Chen, Delgado, Liang, Garnett, Najarian, Majumdar and Yang; Enhanced thermoelectric performance of rough silicon nanowires. Nature, 2008, (451), 163-167].

Huang, Sun and Sun. Effect of characteristic size on the effective thermal conductivity of anodic aluminum oxide (AAO) porous thin films, Adv. Mater. Res., 2012, (399-401), 641-645].

\* cited by examiner

Fig. 6

NANOSTRUCTURED THERMOELECTRIC LAMINATES AND A METHOD TO ENHANCE THE POWER FACTOR AND AERIAL POWER DENSITY OF SUCH THERMOELECTRIC LAMINATES BASED ON VERTICALLY ORIENTED AND DENSLY ARRAYED NANOWIRES

CROSS-REFERENCE TO RELATED APPLICATION

This application is related to application Ser. No. 13/346,760 filed on Jan. 10, 2012 by Mainstream Engineering Corp. in the name of Justin J. Hill, Ph.D. entitled A METHOD TO ENHANCE THE POWER FACTOR OF THERMOELECTRIC LAMINATES BASED ON VERTICALLY ORIENTED AND DENSELY ARRAYED NANOWIRES (Our Ref.: 62950US), the disclosure of which is incorporated by reference herein.

BACKGROUND AND SUMMARY OF THE INVENTION

The present invention is directed to nanostructured thermoelectric elements and the like, and a method for enhancement thereof, namely by combining layer-by-layer assembly of silica or mesoporous silica precursors or other suitable compounds within ordered nanoporous templates, then upon nanowire growth, removal of the template followed by layer-by-layer growth thermoelectric material in the voids; thereby creating a thermoelectric support. These hierarchical templates can be either fabricated freestanding or fabricated directly on support materials such as electrically conductive or insulating material. Furthermore, inclusion of material within the hierarchical nanopores facilitates the directed fabrication of ultra-high aspect ratio nanostructures.

In the primary currently preferred first embodiment, the composite thermoelectric laminates according to the present invention can increase the total power output of a thermoelectric device. In addition, a new process fabricates conformal (or conformable) thermoelectric nanowire arrays embedded within a composite thermoelectric matrix, which are grown on any shaped support when s the initial support is composed of aluminum, zinc, tin, antimony, titanium, magnesium, niobium, tantalum or any other metal that undergoes electrochemical formation of ordered nanopores. The materials listed are known producers of arrayed nanopores under anodic electrochemical oxidation (abbreviated hereto forth as "anodization" or "anodized"). In another contemplated embodiment, the advantages of these nanostructures can be leveraged in applications where ultra high surface area, vertically oriented and arrayed nanostructures are desired such as in batteries, capacitors, electrochemistry, chemical conversion, photovoltaic devices and many other chemical and physical applications as will be apparent to those skilled in such applications.

In a thermoelectric material, the redistribution of charge carriers is simultaneously associated with the formation of an electric field and a temperature gradient. Thus, the external application of a thermal gradient across the material results in the formation of an electrical bias. Likewise, an externally applied bias across the thermoelectric will cause heat to flow through the material. The degree that a particular material responds to either imposition is measured by the material's thermoelectric figure of merit, zT $$zT = \frac{\sigma S^2 T_{av}}{\kappa_e + \kappa_l} \quad (1)$$

where $\sigma$, $S$, $\kappa_e$, $\kappa_l$ and $T_{av}$ are the thermoelectric material's electrical conductivity, Seebeck coefficient, thermal conductivity due to electrons and phonons (lattice contribution), and average temperature, respectively. Thermoelectric efficiency increases with both zT in Equation. (1) and the Carnot efficiency ('c=$1_j$ $T_{cold}$=$T_{hot}$), which is given by the ratio of temperatures from heat-source to heat-sink.

Theoretical calculations show the immense potential that ultra-low diameter nanostructures can have on zT. [see, e.g., Hicks and Dresselhaus; *Thermoelectric figure of merit of a one-dimensional conductor*. Phys. Rev. B, 1993, (47), 16631-16634]. Such calculations show, however, that significant enhancements in zT are only observed once the confinement length (i.e. nanowire diameter) drops below 20 nm. Only at dimensions below 10 nm is the nanostructure confinement on the order of or less than that of the phonon wavelength. A 100-fold increase in phonon scattering has been found as nanowire diameter decreased from 20 to 1 nm, while electron scattering only decreased by a factor of 2. [see, Kim, Stroscio, Bhatt, Mickevicius and Mitin; *Electron-Optical-Phonon Scattering Rates in a Rectangular Quantum Wire*. J. Appl. Phys., 1991, (70), 319-325]. Therefore, achieving zT, 4 likely requires nanostructures with diameters less than 5 nm.

It is possible to reduce the diameter of the AAO below its natural lower limit by incorporation of other materials within or on the walls of the AAO pores. This has been accomplished through filling the AAO pores with mesoporous silica, coating the AAO pores with mesoporous silica [see, Hill, Cotton and Ziegler; *Alignment and Morphology Control of Ordered Mesoporous Silicas in Anodic Aluminum Oxide Channels by Electrophoretic Deposition*. Chem. Mater., 2009, (21), 1841-1846], or layer-by-layer deposition on the AAO template [see Liu, Wang, Indacochea and Wang; *Interference color of anodized aluminum oxide (AAO) films for sensor application*, Sensors and Smart Structures Technologies for Civil, Mechanical, and Aerospace Systems 2009, 2009, (7292), 729217-11]. Furthermore, the fabrication of thermoelectric nanostructures within ultra-low diameter nanopores has been predicted and partially verified to substantially enhance factors contributing to thermoelectric performance.

While ultra-low diameter nanowires show significant increase in zT, the low diameters limit the maximum power output of the device. The total power output of a thermoelectric device is the power factor (or PF), $$PF = S^2 \sigma$$

where S and $\sigma$ are the Seebeck coefficient and electrical conductivity respectively. PF is very similar to zT but does not account for the thermal conductivity of the thermoelectric material, as this is only a factor in efficiency. The PF is instead representative of the amount of energy that can be produced by the device. Increasing the PF of a nanostructured thermoelectric device will allow for greater energy generation in applications where maximum energy needs to be produced from an excess of heat.

A primary object of the present invention is the ability to increase the thermoelectrically active area of the device beyond the area of the nanowires. This has been accomplished by selectively removing the AAO template following wall coating of the nanostructures (henceforth referred to as the pore size reduction medium [PRM]) and filling of nanostructures with thermoelectric material. This freestanding nanostructure can then be supported by filling the nanoscale void with thermoelectric material, thereby increasing the total power output of the device.

BRIEF DESCRIPTION OF THE DRAWINGS

These and further features, objects and advantages of the present invention will become more readily apparent from the following detailed description when taken in conjunction with the accompanying drawings wherein:

FIGS. 4a and b are SEM images of a $Bi_2Te_3$ thermoelectric nanowire array obtain from the method shown in FIGS. 1a-1h;

DETAILED DESCRIPTION OF THE DRAWINGS

Figure 1:
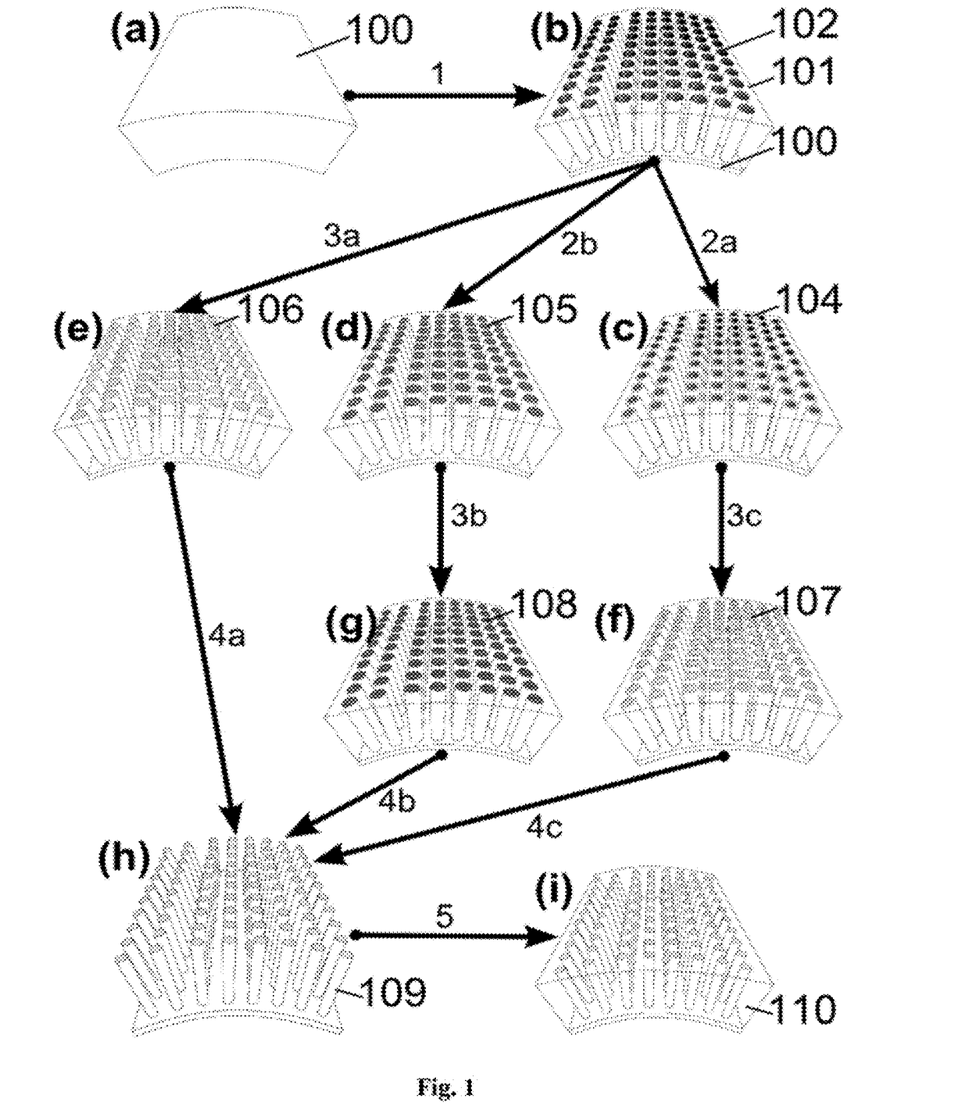
FIG. 1a is a perspective view of a piece of aluminum or any of the other above-mentioned sitable materials that has been shaped to be conformal with a heat generating surface prior to the first step employed in the general inventive method of the present invention.
FIG. 1b shows the aluminum piece shown in FIG. 1a but now with a supported or freestanding ordered nanoporous aluminum oxide (AAO) template obtained from electrochemical anodization to form high density and ordered nanopores.
FIG. 1c shows the AAO template of FIG. 1b with reduced nanopore diameters due to inclusion of a PRM to form a wall-coated nanopore array by electrostatic enhanced dip-coating with a material such as mesoporous silica or other compound.
FIG. 1d shows the AAO template of FIG. 1b with reduced nanopore diameters due to inclusion of a PRM to form a hierarchical nanopore by electrodeposition of a mesoporous material such as mesoporous silica.
FIG. 1e shows the AAO template of FIG. 1b that has been filled with a material to facilitate nanostructure growth within the nanopore with a diameter in the range of 10-500 nm and length in the range of 0.01-10,000 μm.
FIG. 1f shows the wall-coated AAO/PRM template of FIG. 1c that has been filled with a material to facilitate ultra-high aspect ratio nanostructure growth.
FIG. 1g shows the hierarchical AAO/PRM template of FIG. 1d that has been filled with a material to facilitate ultra-high aspect ratio nanostructure growth.
FIG. 1h shows a freestanding nanostructure array on the aluminum remaining from selective aluminum oxide etching of the templates obtained in FIG. 1e, 1f or 1g.
FIG. 1i shows a nanostructure array obtained from selective etching of the templates of FIG. 1e, 1f, or 1g that has been re-supported with a thermoelectric material similar to that within the nanopores

FIG. 1 depicts the overall method for implementing the present invention. Aluminum is first molded into a shape such that it is conformal with the part to which it will be mated. Alternatively, the mating part itself may be used in the first step as long as it is constructed of aluminum or another suitable material as mentioned above. The part is then placed in a cold acid bath and anodized to form the nanoporous template, with anodization time depending on the desired pore depth and the final template etched to open up the bottom of the pore as well as slightly widen the pores. The anodization voltage, bath temperature as well as acid composition and concentration are adjusted to control oxide growth rate, pore diameter and density. At this point, the thermoelectric (or other) material can be electrodeposited into the template, forming high aspect ratio nanowires. Alternatively, a material can be used to coat the nanopores with a pore reduction material to obtain wall-coated nanopores in order to shrink the diameter down below the lower limit obtained with anodization.

Once the nanoporous template is filled with a thermoelectric material, the AAO can be selectively dissolved, leaving behind and array of ultra-high aspect ratio PRM-coated or bare nanostructures. This array, while fragile, has better efficiency in a thermoelectric device due to the fact that all thermal energy is transported through the thermoelectric nanostructure material. Though the AAO has a low thermal conductivity, as low as 0.1 W/mK, and the bare PRM-coated nanostructure array is more desirable, it is also possible to support the PRM-coated nanostructure array in another material with a lower thermal conductivity material by simple dip coating methods to minimize the heat transport through the array. Alternatively, as presented in this invention, the nanostructures may be supported by further electrodeposited thermoelectric material of the composition previously presented. Controlling the pore density and interpore distance to force a confinement effect within the backfilled thermoelectric material will maximize the zT and power factor of the device.

In particular, FIG. 1a shows a shaped piece of aluminum 100. The aluminum can be moderate to high purity. Shaping the aluminum prior to anodization allows for the non-conformable AAO template to adopt the shape of the mating part and can be performed by mechanical methods, extrusion or any other method that alters the shape of the as-obtained aluminum. This enables ideal thermal contact with the mating part, thereby reducing heat loss and maximizing power output if the template is to be used to manufacture ultra-high aspect ratio, ultra-low diameter nanostructured thermoelectric devices. In Step 1 (as indicated by the arrow between FIGS. 1a and 1b), the piece is placed in a cold acid bath and anodized to form the nanoporous template shown in FIG. 1b, with anodization time depending on the desired pore depth and the final template etched to open up the bottom of the pore as well as slightly widen the pores.

FIG. 1b now shows the conformal aluminum work-piece 100 after anodization, creating a aluminum supported AAO nanoporous template composed of an aluminum oxide matrix 101 containing a plurality of nanopores 102 that can be used as a structure-directing medium for nanostructure fabrication. The aluminum support 100 acts as an electrode to the nanostructure bottoms when fabricated within the template 101. Alternatively, the aluminum can be removed to create a conformal AAO template. The spacing and pore diameter of the nanopores 102 found within the AAO template 101 are uniform and can be controlled by altering the voltage or acid concentration/composition of the anodization process. Lower applied voltage for a given acid electrolyte generally reduces the pore diameter and spacing (increase pore density). The lower limit of AAO pore diameter is approximately 10 nm which achieves one of the primary objects of the present invention, namely AAO pore wall coating or inclusion of mesoporous material within the AAO pores to further reduce the diameter of the, now hierarchically structured, template.

In Step 2a, a material can be used to coat the nanopores with a pore reduction material to obtain wall-coated nanopores 104 (denoted heretofore as PRM) in order to shrink the diameter down below the lower limit obtained with anodization. FIG. 1c shows a template composed of an AAO 100 plus matrix 101 and a plurality of nanopores 102 whose walls have now been coated with a PRM 104 such as, but not limited to, mesoporous silica or other colloidal compounds. This then creates a Type I hierarchical template for nanostructure growth. The PRM coating 104 can be performed by placing the AAO template into a solution containing the PRM with a pH that induces oppositely charged surfaces on the PRM and aluminum oxide, respectively. This is done by careful selection of the PRM such that the PRM's isoelectric point at the pH of the given solution induces a surface charge opposite the AAO due to the isoelectric point of the aluminum oxide. This method of electrostatic enhanced dip-coating deposition is, of course, not the only way to pore wall-coat 104 as any other known method that effectively obtains pore wall-coated AAO templates is acceptable. Using such compounds as mesoporous silica also has the added advantage of creating rough pore walls which has been shown to enhance thermoelectric performance of nanostructures. [see, Hochbaum, Chen, Delgado, Liang, Garnett, Najarian, Majumdar and Yang; *Enhanced thermoelectric performance of rough silicon nanowires*. Nature, 2008, (451), 163-167].

Alternatively, with reference to Step 2b electric fields can be used to both (a) deposit a PRM within the AAO nanopores and (b) to form and axially align pores intrinsic to mesoporous PRMs 105 within the AAO nanopores to create a Type II hierarchical structure. The result is shown in the AAO template in FIG. 1d where a mesoporous material has been electrodeposited within each aluminum oxide nanopore 102 to create mesopores 105 composing a Type II hierarchical template for nanostructure growth. The applied electric fields have been shown in the present invention not only to fully incorporate the PRM into the AAO pore but also to axially align the mesopores 105 of the PRM with each AAO pore. [see, Hill, Cotton and Ziegler; *Alignment and Morphology Control of Ordered Mesoporous Silicas in Anodic Aluminum Oxide Channels by Electrophoretic Deposition*. Chem. Mater., 2009, (21), 1841-1846]. Inclusion of a thermoelectric material within this type II hierarchical template aids the thermoelectric device by increasing pore, and thus nanostructure, density.

In Step 3a, thermoelectric or suitable material can be electrodeposited into the template, forming high aspect ratio nanowires with the result shown in FIG. 1e where the nanopores 102 without a PRM have been filled with a material to produce nanostructures 106. This material can also be included within the AAO by other known methods. When the AAO template 101 is fabricated such that it is in electrical contact with the aluminum 100 from which it was made, the subsequently produced nanostructures 106 are in excellent electrical and thermal contact with the aluminum 100.

FIG. 1f shows the Type I hierarchical template 100 in which in Step 3c a nanostructure material 107 is included, resulting in reduced diameter nanopores 104. The coated nanopores 104 can be roughened to enhance thermoelectric material performance. Furthermore, the coated nanopores 104 have a reduced pore diameter. If the pore diameter, and thus nanostructure, is reduced below 20 nm and the nanostructure includes a thermoelectric material, significant thermoelectric performance enhancements should occur. Moreover, this method can be used to investigate the separation of thermal and electrical conductivity at the nanoscale as well as to evaluate nanoscale effects on thermopower. This device, along with theoretical modeling, can be used as an apparatus to evaluate phonon particle characteristics due to the controllability of the nanostructure diameter.

Alternatively to Step 3a, the nanopores 102 can be filled in Step 3b with material with a reduced diameter due to the PRM so as to create the Type II hierarchical structure shown in FIG. 1g having a plurality of mesopores 108 with a nanostructure material therein. All the same attributes highlighted in the description of FIG. 1f template structure are also found here with the additional benefits of higher nanowire density.

The resulting AAO 101 in FIGS. 1c-e can be selectively dissolved in Steps 4a-c, respectively, leaving behind and array of ultra-high aspect ratio PRM-coated or bare nanostructures 109 shown in FIG. 1h where now freestanding nanostructures 106, 107 or 108 on the formed aluminum 100 are obtained. These freestanding arrays can be obtained from the filled AAO, Type I or Type II templates. This system is more fragile than the systems that are shown in FIG. 1e, FIG. 1f or FIG. 1g, but has better thermoelectric performance if the pore filling material is thermoelectric in nature. This performance enhancement is due to the lower thermal conductivity of the air (or vacuum) that now separates the nanostructures 106, 107 or 108, forcing the majority of thermal energy to flow through the nanostructures and thus maximizing power generation.

As seen in Step 5, the PRM-coated nanostructure array can be supported in another material with a similar thermoelectric material 110 by simple dip coating methods. The material 110 acts to structurally support the PRM-coated nanostructure array as well as minimize the amount of heat transported through item 110 as well as increase the power factor of the laminate since it is also thermoelectrically active. The resulting array shown in FIG. 1i is one of the free standing nanostructure array items 106, 107 or 108 shown in FIG. 1h and produced by Steps 4a, 4b or 4c that has been re-supported with a thermoelectric matrix material which increases the power factor and aerial power density of the composite thermoelectric laminate. This material can be fabricated by coating methods or other methods and the material 110 can be an identical in composition to the thermoelectric material which comprises the nanowires or can be varied in composition to optimize phonon confinement in both the nanowire (106, 107 and 108) and thermoelectric matrix 110.

Figure 2:
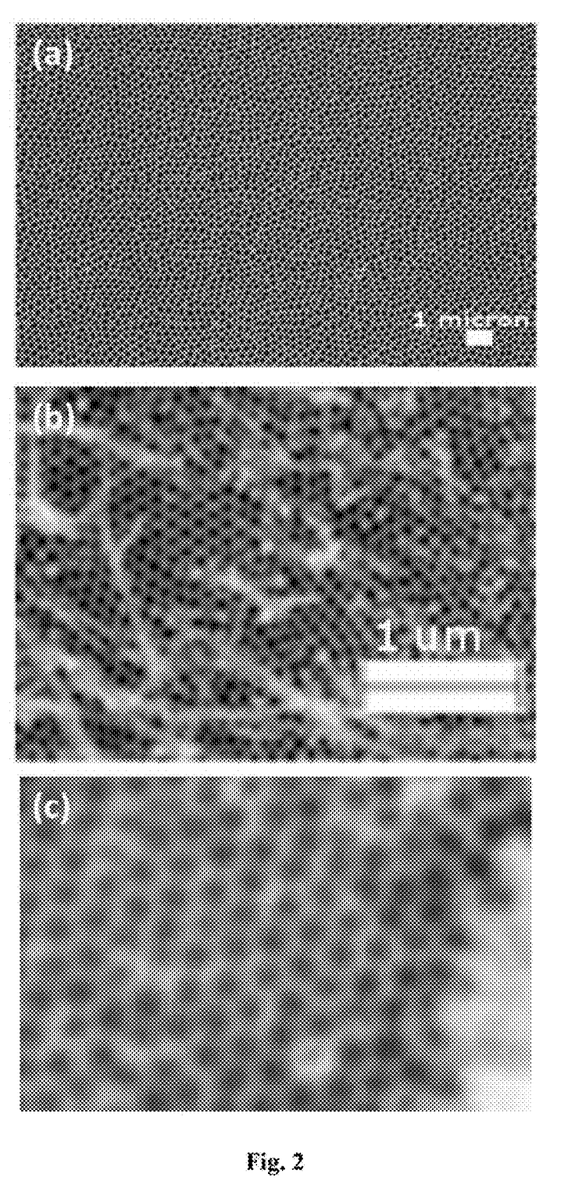
FIGS. 2a-c are SEM images of AAO fabricated with different pore sizes.

FIGS. 2a-c are SEM images of AAO produced in accordance with the present invention with different pore sizes. As shown, the pores are 150, 50 and 10 nm, respectively. These AAO templates were fabricated on transparent and conductive tin-doped indium oxide, on glass and as such could be incorporated into a solar cell device or other structure that requires optical transparency. FIG. 2a is the SEM image of 10-20 nm pores fabricated by anodization of aluminum in 5° C., 0.2 M, sulfuric acid at 25 V. The target of the film was the fabrication of low-aspect ratio, low-diameter nanostructures. However, much thicker (200 μm) thick AAO films with target diameters of 10-20 nm have also been fabricated. FIG. 2b is an SEM image of pores obtained from aluminum anodization in 10° C., 0.3 M oxalic acid at 60 V, yielding 45 nm pores, and FIG. 2c is an SEM image of 145 nm AAO pores obtain from anodization in 1.3 M phosphoric acid, at 7° C. at 130 V.

Figure 3:
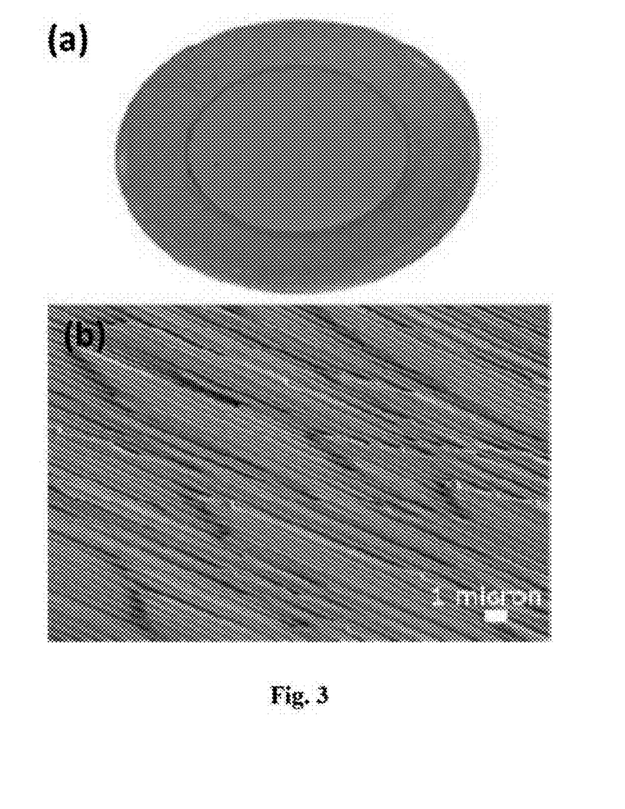
FIG. 3a is an optical photograph of the thermoelectric nanowire film.
FIG. 3b is an SEM image showing ultra-high aspect ratio nanopores with a length of 1.6 mm.
Figure 4:
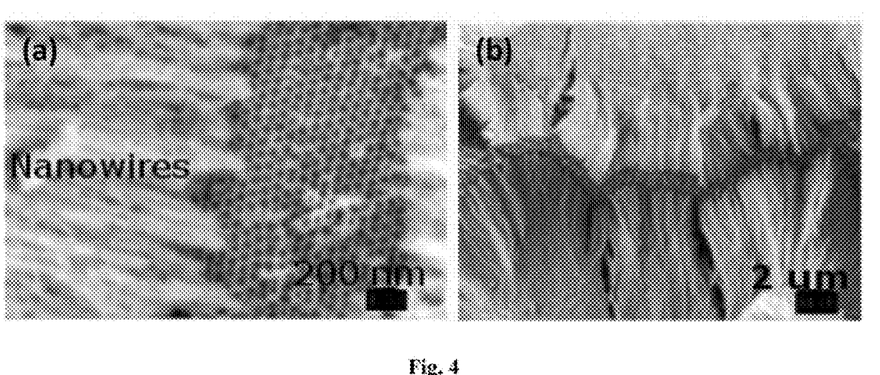

FIG. 3 is an SEM image of ultra-high aspect ratio AAO obtained from hard anodization of aluminum. It shows 1,600 μm (1.6 mm) long AAO nanopores with a mean diameter of 125 nm (aspect ratio of 12,800) and a pore density of approximately $1.1 \times 10^9$ $cm^{-2}$. The aspect ratio of the nanopores obtained here is 12,800 and they are continuous throughout the entire 1.6 mm thickness. The pore growth rate observed in this study was approximately 50 μm/h and complete oxidation of the aluminum substrate was the only factor limiting continued pore growth. As such, aspect ratios much higher can reasonably be expected with thicker aluminum supports and longer anodization times. This is the highest reported aluminum oxide pore aspect ratio obtained from any method of aluminum-based nanopore fabrication method.

Figure 5:
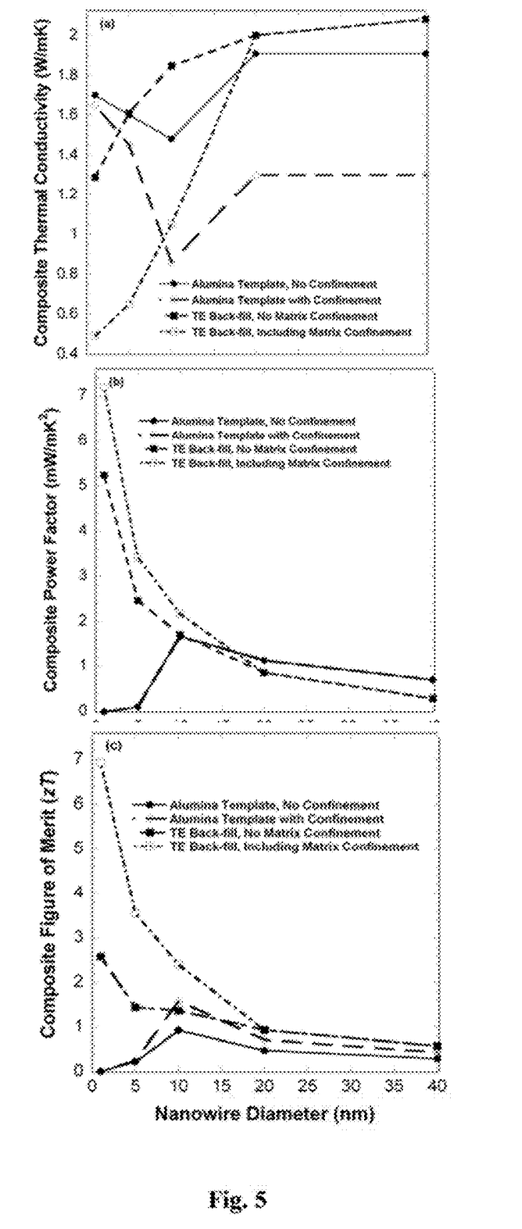
FIGS. 5a-c are graphs showing the effect of thermoelectric backfilling on composite thermal conductivity, power factor, and zT of the device as nanostructure diameter decreases.

FIG. 5 a-c are mathematical representations of the predicted behavior of a nanostructured thermoelectric device with a backfilled thermoelectric support. FIG. 5a shows the composite thermal conductivity of the device as the nanostructure diameter decreases. Here, the traditionally backfilled samples show decrease in composite thermal conductivity as the nanostructure diameter drops toward 10 nm then an increase as the nanostructure diameter approaches 0 nm. However, when the nanostructures are supported with thermoelectric material the composite thermal conductivity drops logarithmically. The effect of pore density is shown by the lines marked with and without template confinement. When the pores are dense and the template is confined below the phonon confinement limit, the composite thermal conductivity drops significantly.

FIGS. 5b and 5c shows how the power factor and zT respectively are affected by utilizing a thermoelectric backfilling technique. Seen in the alumina supported devices, as the nanostructure diameter decreases the power factor of the device increases, until a 10 nm diameter, then drops as the diameter approaches 0 nm. This is due to the increased phonon confinement effect seen in the composite thermal conductivity (FIG. 5a) at 10 nm. When the alumina is removed and a thermoelectric material is used as a support, the power factor and zT of the device increase logarithmically as the nanostructure diameter approaches 0 nm. The power factor and zT increase at nanostructure diameters is predicted to be as much as 10 fold; these calculations assume that confinement is present in the nanowires (106, 107 & 108) and depicts the difference between systems where confinement is present in the thermoelectric matrix (110). The calculations account for the loss of aerial power density due to the PRM shell and when confinement is assumed in the AAO matrix (101), the value for thermal conductivity follows the experimental/computation work of Huang et. al. [see, Huang, Sun and Sun, *Effect of characteristic size on the effective thermal conductivity of anodic aluminum oxide (AAO) porous thin films*, Adv. Mater. Res., 2012, (399-401), 641-645].

Figure 6:
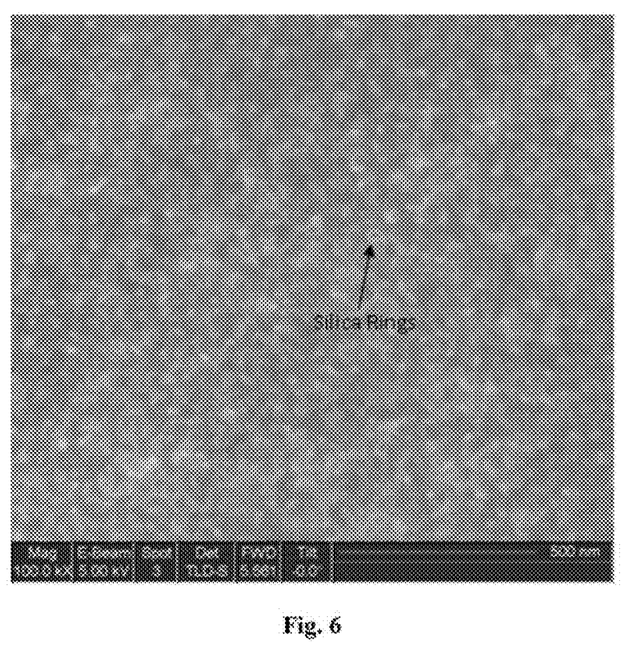
FIG. 6 is an SEM image of a thermoelectric nanostructure supported with thermoelectric material.

FIG. 6 is a SEM image of a thermoelectric nanostructure array formed through the method shown in FIG. 1a-i. Anodized aluminum with 20 nm pores was dip coated with mesoporous silica to achieve a pore diameter of 10 nm; these pores were then filled with $Bi_2Te_3$. The AAO template was then removed with phosphoric acid and the area was then backfilled with further $Bi_2Te_3$ to create a thermoelectric support.

While we have shown and described several embodiments in accordance with the present invention, it should be clearly understood that the same is susceptible to numerous changes and modifications as will now be apparent to one skilled in this art but without departing from our inventive concept. Therefore, we do not intend to be limited to the details shown and described herein but intend to cover all such changes and modifications as are encompassed by the scope of the appended claims.

We claim:

1. A method for fabricating a nanostructured thermoelectric device with an enhanced power and aerial power density, comprising: producing a hierarchical template with ordered and arrayed nanopores on one of a mating part and a support material that is pre-shaped so as to be conformable to the mating part, optionally layering at least one compound within the nanopores to reduce the diameter thereof, supplying the template with a thermoelectric filling material; and selectively removing the template to produce freestanding nanostructure arrays and then backfilling the nanostructure arrays on the template with a thermoelectric backfilling material to form nanowires supported by the thermoelectric backfilling material.

2. The method of claim 1, wherein the layering is done layer-by-layer using one of a mesoporous precursor, silica and other charged molecule or colloid.

3. The method of claim 1, wherein the support material is one of electrically conductive and insulating.

4. The method of claim 1, wherein the support material is selected from a material capable of producing the ordered and arrayed nanopores by electrochemical oxidation.

5. The method of claim 4, wherein the support material is selected from one of aluminum, zinc, tin, antimony, titanium, magnesium, niobium and tantalum.

6. The method of claim 1, wherein producing the template includes anodization in a cold acid bath.

7. The method of claim 6, wherein anodization voltage, bath temperature, and acid composition and concentration are selectively adjusted to control oxide growth rate, pore diameter, spacing, uniformity and density of the nanopores.

8. The method of claim 6, wherein anodization time is selected to control depth of the nanopores.

9. The method of claim 1, wherein the optional layering is one of self-initiated by selectively adjusting pH of a coating material and by depositing layering material within the nanopores via an electric field.

10. The method of claim 1, wherein the optional layering is carried out by utilizing two compounds having opposite charges in a solution and inducing a surface charge on the template.

11. The method of claim 1, wherein the optional layering and filling are effected by electric fields.

12. The method of claim 1, further comprising supporting the nanostructure array in a lower thermal conductivity material.

13. The method of claim 1, wherein the thermoelectric filling material is $Bi_2Te_3$ which comprises the nanowire arrays.

14. The method of claim 1, further comprising etching the template so as to selectively widen and open the nanopores at a bottom portion thereof.

15. The method of claim 14, wherein producing the template comprises one of using aluminum as the template to function as an electrode to the bottom of the nanopores and of removing the aluminum after filling the nanopores to create a conformal template.

16. The method of claim 1 wherein the nanowires have a resulting diameter of less than 10 nm.

17. The method of claim 1, wherein the template is fabricated on one of a conductive and semiconductive substrate dissimilar in composition to that of aluminum.

* * * * *

UNITED STATES PATENT AND TRADEMARK OFFICE
CERTIFICATE OF CORRECTION

PATENT NO. : 9,166,136 B1
APPLICATION NO. : 13/863010
DATED : October 20, 2015
INVENTOR(S) : Justin J. Hill and Gregory Chester Page 1 of 1

It is certified that error appears in the above-identified patent and that said Letters Patent is hereby corrected as shown below:

Title page Item (54) line 3, and in the Specification Column 1, line 3, "AERIAL" should read --AREAL--.

Specification

Column 2, line 11, "(c=1j Tcold=Thot)" should read --$\eta = 1 - T\_cold/T\_hot$--.

Column 2, line 27, "zT,4" should read --$zT \geq 4$--.

Column 3, line 46, --;-- should be inserted after "nanopores".

Column 6, line 37, "aerial" should read --areal--.

Column 7, line 40, "aerial" should read --areal--.

Claims

Column 8, line 3, "aerial" should read --areal--.

Signed and Sealed this
Fifteenth Day of March, 2016

Michelle K. Lee
*Director of the United States Patent and Trademark Office*